(12) United States Patent
Lee et al.

(10) Patent No.: US 10,665,303 B1
(45) Date of Patent: May 26, 2020

(54) ERASING BLOCKS WITH FEW PROGRAMMED PAGES

(71) Applicant: Macronix International Co., Ltd., Hsinchu (TW)

(72) Inventors: Ya-Jui Lee, Taichung (TW); Kuan-Fu Chen, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 16/409,470

(22) Filed: May 10, 2019

(51) Int. Cl.
*G11C 16/16* (2006.01)
*G11C 16/34* (2006.01)
*G11C 16/04* (2006.01)
*G11C 16/26* (2006.01)
*G11C 16/10* (2006.01)

(52) U.S. Cl.
CPC .......... *G11C 16/16* (2013.01); *G11C 16/0483* (2013.01); *G11C 16/10* (2013.01); *G11C 16/26* (2013.01); *G11C 16/3445* (2013.01)

(58) Field of Classification Search
CPC ..... G11C 16/16; G11C 16/0483; G11C 16/10; G11C 16/26; G11C 16/3445
See application file for complete search history.

(56) References Cited

U.S. PATENT DOCUMENTS

| | | | | |
|---|---|---|---|---|
| 9,679,658 B2* | 6/2017 | Pelster | ................... | G11C 16/16 |
| 9,727,401 B2* | 8/2017 | Han | ...................... | G06F 11/076 |
| 9,728,275 B2* | 8/2017 | Tsuji | ..................... | G06F 3/0679 |
| 9,830,963 B1* | 11/2017 | Pang | ................ | H01L 27/11582 |
| 9,965,205 B2* | 5/2018 | Kim | ....................... | G06F 3/0652 |
| 2009/0154252 A1 | 6/2009 | Shibata | | |
| 2014/0104950 A1 | 4/2014 | Yano | | |
| 2018/0108419 A1* | 4/2018 | Lin | ......................... | G11C 8/08 |
| 2019/0088338 A1* | 3/2019 | Iwai | ...................... | G11C 16/14 |

OTHER PUBLICATIONS

European Search Report issued in related EP Application No. 19177915.6 dated Dec. 19, 2019, 10 pages.

* cited by examiner

*Primary Examiner* — Tri M Hoang
(74) *Attorney, Agent, or Firm* — Fish & Richardson P.C.

(57) ABSTRACT

Methods, systems and apparatus for effectively erasing blocks with few programmed pages are provided. In one aspect, a system includes a memory and a controller coupled to the memory. The memory includes blocks each having pages. The controller is configured to determine whether a threshold page with a particular page number in a block of the memory is programmed, to erase the block according to a normal erase action in response to determining that the threshold page is programmed, and to erase the block according to a particular erasing action that is configured to erase the block deeper than the normal erase action in response to determining that the threshold page is not programmed. The particular erasing action can include pre-programming the block before erasing the block, decreasing an erase verify voltage before erasing the block, or adding one or more erasing pulses with a new erasing voltage.

20 Claims, 7 Drawing Sheets

ERASING BLOCKS WITH FEW PROGRAMMED PAGES

BACKGROUND

Memory devices or systems such as NAND flash memories are widely used in modern lives. Due to higher storage capacity and lower cost realized by technology scaling, the memory devices or systems have been applied to digital still cameras, Universal Serial Bus (USB) memories, memory cards, media players, cell phones including smart phones, netbooks, and so on. In some cases, users may frequently write and erase short sentences that occupy very small areas of the memory devices or systems, which may cause issues in erasing memory blocks.

SUMMARY

The present disclosure describes systems and techniques for effectively erasing blocks with few programmed pages.

One aspect of the present disclosure features a system including: a memory comprising blocks each having a plurality of pages and a controller coupled to the memory and configured to: determine whether a threshold page with a particular page number in a block of the memory is programmed; in response to determining that the threshold page is programmed, erase the block according to a normal erase action; and in response to determining that the threshold page is not programmed, erase the block according to a particular erasing action that is configured to erase the block deeper than the normal erase action. The particular page number can be pre-determined by empirical results.

The controller can be configured to determine whether the threshold page is programmed by determining whether a flag of the threshold page is identical to a set value. In some cases, the controller is configured to: determine that the threshold page is programmed when the flag of the threshold page is not identical to the set value; and determining that the threshold page is not programmed when the flag of the threshold page is identical to the set value. In some cases, the controller is configured to read the flag of the threshold page from the memory.

In some implementations, the controller is configured to erase the block according to the normal erase action by performing a first erase-verify cycle including applying an erasing pulse with a normal erasing voltage on the block and performing an erase verify test by verifying whether a number of memory cells having threshold voltages no smaller than a normal erase verify voltage is smaller than a threshold number; in response to determining that the number of memory cells is smaller than the threshold number, determining that the block passes the erase verify test and performing no further erasing; and in response to determining that the number of memory cells is not smaller than the threshold number, performing one or more erase-verify cycles until the block passes the erase verify test, wherein the normal erasing voltage is increased by a step voltage per cycle. The step voltage can be fixed per cycle.

In some cases, the controller is configured to erase the block according to the particular erasing action by erasing the block according to the normal erasing action, and then performing an extra erase on the block. The controller can be configured to perform the extra erase on the block by applying an extra erase pulse on the block with a particular erasing voltage, wherein the particular erasing voltage is higher than a preceding erasing voltage applied on the block by an extra voltage. The extra voltage can be associated with the particular page number of the threshold page. The extra voltage can be pre-determined based on empirical results. The extra voltage can be different from the step voltage.

In some cases, the controller is configured to perform the extra erase on the block by applying one or more erase pulses on the block, and an erasing voltage in each of the erase pulses is higher than a preceding erase voltage applied on the block by the step voltage. A number of the one or more erase shots can be associated with the particular page number of the threshold page. A number of the one or more erase shots can be pre-determined by empirical results.

In some cases, the controller is configured to erase the block according to the particular erasing action by decreasing the normal erase verify voltage by an extra verify voltage to a new erase verify voltage and performing erase-verify cycles on the block using the new erase verify voltage. The extra verify voltage can be associated with the particular page number of the threshold page and pre-determined based on empirical results.

In some cases, the controller is configured to erase the block according to the particular erasing action by pre-programming the block, and then performing erase-verify cycles on the block according to the normal erasing action. The controller can be configured to perform the erase-verify cycles on the block by using the normal erase voltage, the step voltage, and the normal erase verify voltage.

The controller can be configured to pre-program the block by applying a programming voltage on pages of the block such that a number of programmed pages in the block is larger than the particular page number. The controller can be configured to pre-program the block by pre-programming all of pages in the block. The programming voltage can be pre-determined based on empirical results. The controller can be configured to pre-program the block without verification on programmed states of memory cells in the block.

In some implementations, the controller is configured to: after erasing the block, program the block, read the block to determine a distribution of threshold voltages of memory cells in the programmed block, and determine whether the block exhibits an effect of shallow erase based on a result of the determined distribution of threshold voltages of memory cells in the programmed block.

In some implementations, the controller is configured to: determine whether a first threshold page with a first page number in the block is programmed; in response to determining that the first threshold page is programmed, erase the block according to the normal erase action; in response to determining that the first threshold page is not programmed, determine whether a second threshold page with a second page number in the block is programmed, the second page number being smaller than the first page number; in response to determining that the second threshold page is programmed, erase the block according to a first erase action that is configured to erase the block deeper than the normal erase action; and in response to determining that the second threshold page is not programmed, erase the block according to a second erase action that is configured to erase the block deeper than the first erase action.

Another aspect of the present disclosure features a method of erasing blocks in a memory. The method includes: determining whether a threshold page with a particular page number in a particular block of the memory is programmed and in response to determining that the threshold page is not programmed, erasing the block according to a particular erasing action that is configured to erase the block deeper than a normal erase action. The normal erase action is applied for a block having a plurality of programmed pages, a number of the plurality of programmed pages being larger than the particular page number.

The particular erasing action can include at least one of pre-programming the block before erasing the block, decreasing an erase verify voltage before erasing the block, or adding one or more erasing pulses with a new erasing voltage.

The techniques implemented in the present disclosure can be applied to various memory types, such as SLC (single-level cell) devices, MLC (multi-level cell) devices like 2-level cell devices, TLC (triple-level cell) devices, or QLC (quad-level cell) devices. The techniques can be applied to various dimensions of memory systems, such as two-dimensional (2D) memory systems or three-dimensional (3D) memory systems. The techniques can be applied to various types of non-volatile memory systems, such as NAND flash memory, NOR flash memory, among others. Additionally or alternatively, the techniques can be applied to various types of devices and systems, such as secure digital (SD) cards, embedded multimedia cards (eMMC), or solid-state drives (SSDs), embedded systems, media players, mobile devices, among others.

The details of one or more disclosed implementations are set forth in the accompanying drawings and the description below. Other features, aspects, and advantages will become apparent from the description, the drawings and the claims.

DETAILED DESCRIPTION

Figure 1A:
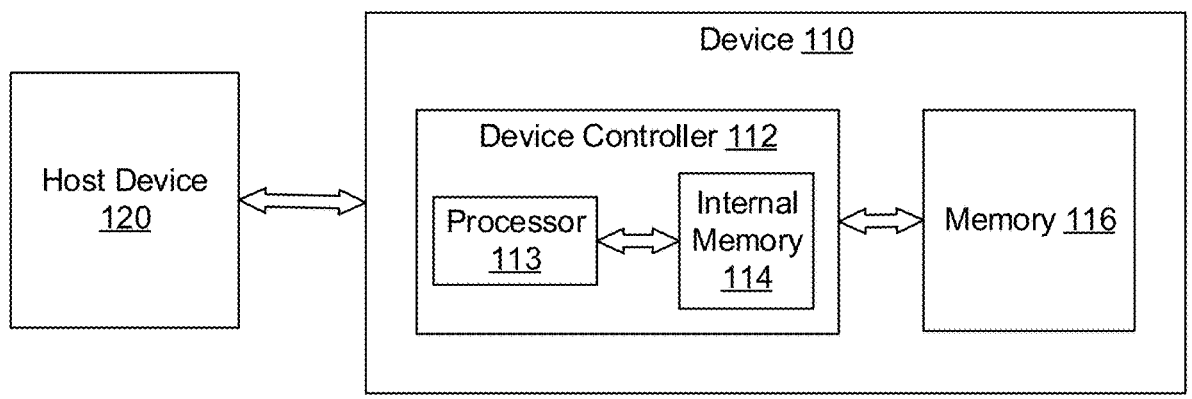
FIG. 1A illustrates an example of a system including a memory device, according to one or more implementations.

Under certain circumstances, a user may program few pages in a block of a memory and then erase the whole block. However, due to low amount of bits of the few pages in the block, it may be very easy for the block to pass an erase verify test. This may induce shallow erase problem, where memory cells in the block are not erased enough to be in a normal erase state.

Implementations of the present disclosure provide systems and techniques addressing the shallow erase problem in blocks having few programmed pages. Particularly, a new erase process can be used and can include determining whether a threshold page with a particular page number in the block is programmed before erasing. For example, a flag, e.g., an erase flag, of the threshold page can be pre-read. If the flag is a set value, e.g., 0, it indicates that the threshold page is programmed, and the block has enough programmed pages and will not suffer from shallow erase problem and can perform a normal block erase action (or operation) including erase verify. In contrast, if the flag of the threshold page is not the set value, e.g., a different value such as 1, it indicates that the threshold page is not programmed, and the block has few programmed pages and may suffer from shallow erase problem if a normal block erase action is performed. Thus, a new erase action can be performed on the block to erase deeper in the block.

In some implementations, the new erase action includes one or more extra erase pulses with a particular erase voltage after the normal block erase operation. The particular erase voltage can have a particular increased step voltage, different from the step voltage for the normal block erase operation. The particular erase voltage can be pre-determined, e.g., based on empirical results. The particular erase voltage can vary with the page number of the threshold page. In some implementations, the new erase action includes a number of extra erase pulses after the normal block erase operation. The extra erase pulses have an erase voltage increased by the normal step voltage.

In some implementations, the new erase action includes changing an erase voltage setting for deep erase before performing the normal block erase with erase verify. For example, the erase verify voltage in the new erase action can be set to be a lower voltage than the normal erase verify voltage. The new erase verify voltage can be determined based on empirical results. The new erase verify voltage can vary with the threshold page number. In some implementations, the new erase action includes pre-programming the block (e.g., all pages in the block) before the normal block erase action, such that the amount of bit counts to be erased is larger enough to overcome the shallow erase problem. In such a way, an erase depth of the block can be controlled by the normal erase with the normal erase verify voltage. The pre-programming voltage can be selected so that the memory cells are programmed to have threshold voltages higher than the threshold voltage of the erased state. No programming verification is needed to verify that the memory cells are in particular programmed states.

With the techniques, there can be no extra endurance loss because the new erase actions are executed not in regular cases, but only in the cases when the block is determined, e.g., by checking the flag of a threshold page, to have few programmed pages. Moreover, the new erase actions use extra erase pulses or lower erase verify voltages to make few programmed memory cells be erased to get normal erase depth, not to be over erased. Thus, there is no extra erase damage or erase performance loss.

FIG. 1A illustrates an example of a system 100 for erasing and/or programming data. The system 100 includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

Figure 1B:
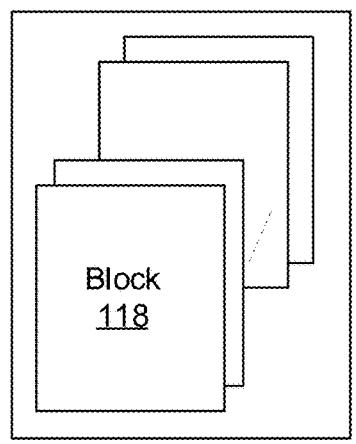
FIG. 1B illustrates an example of a memory including memory blocks, according to one or more implementations.

FIG. 1B illustrates an example configuration of the memory 116 that includes a plurality of blocks 118. The memory 116 can be a two-dimensional (2D) memory or a three-dimensional (3D) memory.

Figure 1C:
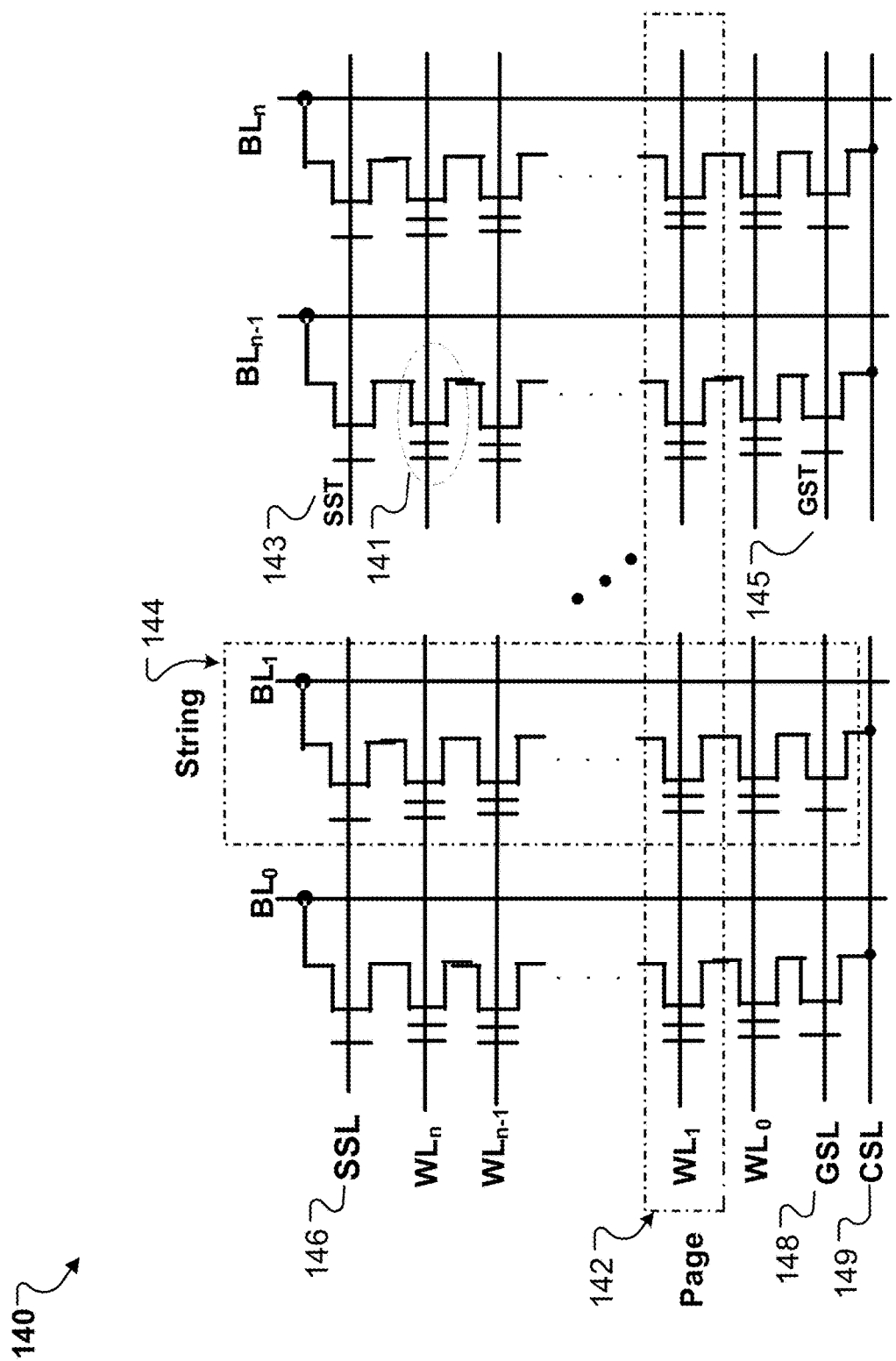
FIG. 1C illustrates an example block of a two-dimensional (2D) memory, according to one or more implementations.

FIG. 1C illustrates an example configuration of a two-dimensional (2D) memory block 140 when the memory 116 is a 2D memory. The block 140 can be the block 118. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142. A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs in different strings are also connected to the same SSL. Gates of the memory cells 141 are respectively connected to word lines $WL_0$, $WL_1$, ..., $WL_{n-1}$, $WL_n$. The memory cells 141 are connected to a common source line (CSL) 149 via the GST 145. A gate of the GST 145 is connected to a ground select line (GSL) 148. Gates of the GSTs in different strings are also connected to the same GSL. A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

The device 110 can include a Flash Translation Layer (FTL) to manage read, write, and erase operations. The FTL can be stored in the device controller 112, e.g., in the internal memory 114. The FTL uses a logical-to-physical (L2P) address mapping table storing mapping from logical pages in a logical block to physical pages in a physical block.

Figure 1D:
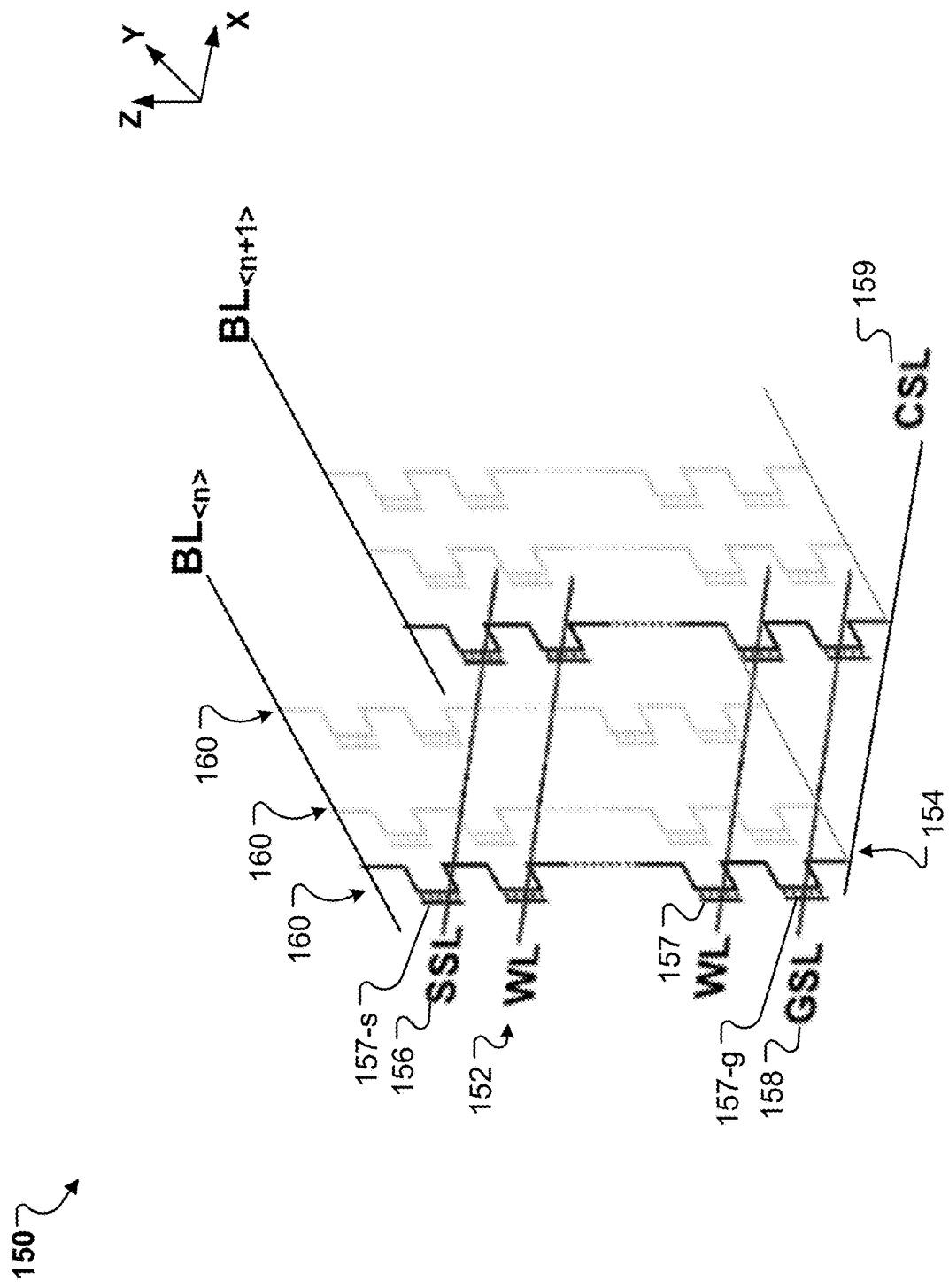
FIG. 1D illustrates an example block of a three-dimensional (3D) memory, according to one or more implementations.

FIG. 1D illustrates an example 3D memory block 150 when the memory 116 is a 3D memory. The memory block 150 can be the block 118. Memory cells 157 are arranged in three dimensions, e.g., in an XYZ coordinate system, and coupled to a number of word lines to form a number of cell pages 152 and a number of bit lines to form a number of cell strings 154. A cell string 154 includes a number of memory cells 157 connected in series, where a memory cell 157-s can be configured as an SST coupled to a string select line (SSL) 156 and a memory cell 157-g can be configured as a GST coupled to a ground select line (GSL) 158. The memory cells 157 are connected to a common source line (CSL) 159 via the GSTs.

The memory block 150 can include a number of memory layers 160 stacked together, e.g., vertically along a Z direction. Each memory layer 160 can be a two-dimensional planar layer, e.g., in an X-Y plane, containing a number of cell pages 152. Each cell page 152 can be individually read and/or programmed. To read a particular cell page 152 in a memory layer 160 in a read operation, a lower voltage is applied onto a word line corresponding to the particular cell page 152. The lower voltage is also applied onto other cell pages 152 in the memory layers 160. Meanwhile, a higher voltage is applied onto the other memory layers in the block 150.

A memory cell can be in a programmed state or in an erased state. For example, if the memory cell is a SLC, the memory cell can be programmed to a programmed state "0" and be erased to an erased state "1". If the memory cell is an MLC that can store two-bit data. The memory cell can be programmed to any one of programmed states (0,1), (0,0), and (1,0) or erased to the erased state (1, 1). For illustration only, SLC is used as the memory cell.

Once programmed or erased, the memory cell has a corresponding threshold voltage. The threshold voltage is a characteristic of the memory cell. When a read voltage equal to or greater than the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Figure 2A:
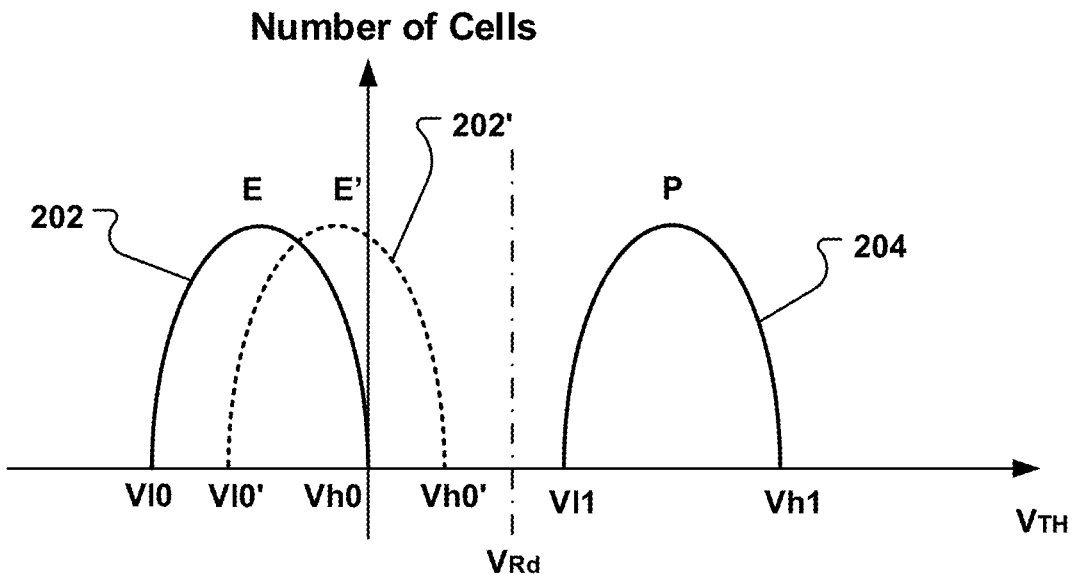
FIG. 2A illustrates examples of threshold voltage distributions of memory cells programmed after normal erase and shallow erase, according to one or more implementations.

Threshold voltages of a number of memory cells in a block that correspond to the same state, e.g., the erased state or a programmed state, can have a distribution, e.g., a range between a lower limit voltage and a higher limit voltage. A memory cell having a threshold voltage within the range is considered to be in the corresponding state. In other words, a memory cell being in a state has a threshold voltage within the range. For example, as illustrated in FIG. 2A, if the memory cell has a threshold voltage between Vl0 and Vh0, the memory cell is in the erased state E; if the memory cell has a threshold voltage between Vl1 and Vh1, the memory cell is in the programmed state P. Curves 202 and 204 show threshold voltage distributions of the respective states E and P of the memory cells, respectively.

During a normal program operation, a memory cell is programmed from an erased state, e.g., the erased state E, to a programmed state, e.g., the programmed state P, by applying a programming voltage on the memory cell and verifying whether the programmed memory cell is in the programmed state. The verifying action can use a verifying voltage, e.g., a threshold voltage of the programmed state, e.g., Vl1 for the programmed state P, to verify whether the memory cell is programmed to the programmed state. The program/verify cycle may repeat multiple times until the memory cell is programmed and verified to be in the programmed state.

During a normal read operation, a read voltage can be applied to a word line coupled to a gate of the memory cell to determine whether the selected memory cell is a turned-on or turned-off state. When a read voltage VRd that is larger than the threshold voltage of the erased state E but smaller than the threshold voltage of the programmed state P is applied, the memory cell is turned on when it has the erased state and turned off when it has the programmed state.

During a normal erase operation, memory cells, e.g., in a block or other units, are erased. In some implementations, the memory cells are erased in a normal erase operation by raising a p-well region of the memory cells to an erasing voltage for a period of time and grounding word lines of a selected block or unit (that are connected to gates of the memory cells), while source and bit lines are floating. The erase voltage can be higher than a threshold voltage for the memory cells. In blocks or units that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to tunnel oxide layers of selected memory cells and the selected memory cells are erased as electrons of the floating gates are emitted to the substrate side, e.g., by Fowler-Nordheim tunneling mechanism. As electrons are transferred from the floating gate to the p-well region, the threshold voltage of a selected cell is lowered.

After the erasing voltage is applied to erase the memory cells, the memory cells in the block or unit can be in the erased state or still in the programmed state. The threshold voltages of the memory cells can have a distribution, as illustrated by curve 252 or 254 of FIG. 2B. A controller, e.g., the device controller 112 of FIG. 1A, can then execute an erase verify operation to verify whether or not the erased memory cells are in the erased state, e.g., by applying an erase verify voltage $V_E$. If the threshold voltage of a given memory cell is below $V_E$, the controller can determine the memory cell is properly erased to be in the erased state. If the controller determines that a number of memory cells (or a count of bits or a count of strings) that have threshold voltages larger than $V_E$ is below a threshold number (e.g., 3, 4, or 5), the controller determines that the block passes the erase verify test and no more erasing is needed for the block.

If the controller determines that the number of memory cells that have threshold voltages larger than $V_E$ is identical to or above the threshold number, the controller determines that the block does not pass the erase verify test and more erasing is needed. In the normal erasing operation, the controller can increase the erasing voltage with a step voltage and apply the increased erasing voltage to erase the memory cells and verify again. The step voltage can be fixed, e.g., 1 Volt (V). In the normal erase operation, the erase-verify cycle can repeat a number of times (e.g., 3, 4 or 5 times) until the number of memory cells that have threshold voltages higher than $V_E$ is below the threshold number.

Figure 2B:
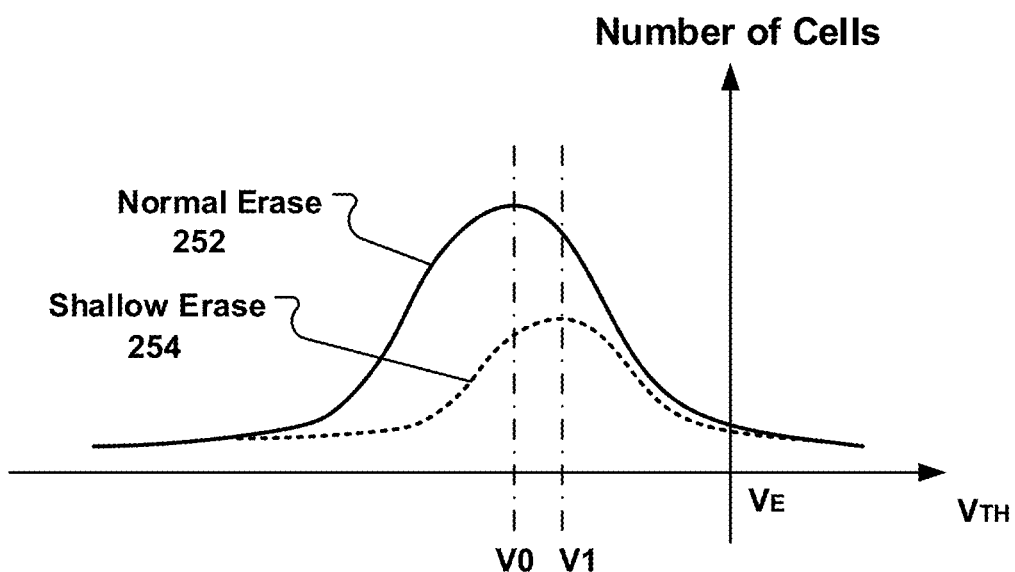
FIG. 2B illustrates examples of threshold voltage distributions of memory cells in normal erase and shallow erase, according to one or more implementations.

Curve 252 in FIG. 2B shows a distribution of threshold voltages of the memory cells in a block after a normal erasing operation. The block has enough number of programmed pages such that the number of memory cells that have threshold voltages higher than $V_E$ is below the threshold number and the block passes erase verify, and the memory cells are erased to normal erased states with a threshold voltage distribution central at V0.

Curve 254 in FIG. 2B shows a distribution of threshold voltages of the memory cells in a block that has few programmed pages (e.g., less than 5 pages) after a normal erasing operation. Because a smaller number of memory cells are programmed in the block than that in a block having enough programmed pages, there is a higher probability for the block to have the number of memory cells in the block that have threshold voltages higher than $V_E$ below the threshold number and to pass the erase verify. However, the central threshold voltage V1 in curve 254 is larger than the central threshold voltage V0 in curve 252, and the distribution of the threshold voltages in curve 254 is shifted to a higher level than the distribution of the threshold voltages in curve 252. That is, the memory cells in the block may experience shallow erase and are not in the normal erased states. When the block is re-programmed and re-read, the shallowed-erased memory cells may have a threshold voltage distribution shown by curve 202' and curve 204 in FIG. 2A. The memory cells in the shallow erased state may have a lower threshold voltage shifted to Vl0' and a higher threshold voltage shifted to Vh0'.

In some cases, the controller can pre-program a block before erasing. However, the block may have enough programmed pages, and there is no need to pre-program the block to avoid the shallow erase problem. Thus, the pre-programming may unnecessarily degrade the endurance of the block.

In some cases, the controller can change the erase verify voltage to a lower level for erasing any block. However, for a block having enough programmed pages, the block may experience deeper erasing. Thus, changing the erasing verify voltage may also degrade the endurance of the block due to extra stress during cycling.

When a block is programmed, pages in the block are sequentially programmed. For example, the block has N pages. Data can be sequentially programmed into page 0, page 1, page 2, . . . , and page X, where X is an integer and $0 \leq X \leq N-1$. When a page is programmed, a flag indicating that the page is programmed can be written in the memory together with the data programmed in the page. For example, the flag can be stored in a redundancy area of the page or in the memory. The flag can be an erase flag. When the erase flag has a first value. e.g., 0, it indicates that the page has been programmed; when the erase flag has a second value, e.g., 1, that is different from the first value, it indicates that the page has not programmed or the page is ready to be programmed.

Implementations of the present enable determination whether a block has few programmed pages and may experience shallow erase problem by checking whether or not a pre-determined threshold page with a particular page number X in the block is programmed. For example, a controller can check an erase flag of the pre-determined threshold page. If the erase flag is 0, it indicates that the threshold page has been programmed, and there are at least X+1 pages that have been programmed. The controller can determine that the block has enough programmed pages and can avoid shallow erase problem if the block is erased with a normal erase action. If the erase flag is 1, it indicates that the threshold page is not programmed, and there are at most X pages that have been programmed. The controller can determine that the block has few programmed pages and may experience shallow erase problem if the block is erased with a normal erase action. Thus, the controller can perform a new erase action to erase the block. The new erase action is configured to erase the block deeper than the normal erase action such that the block does not have shallow erase problem.

Figure 3A:
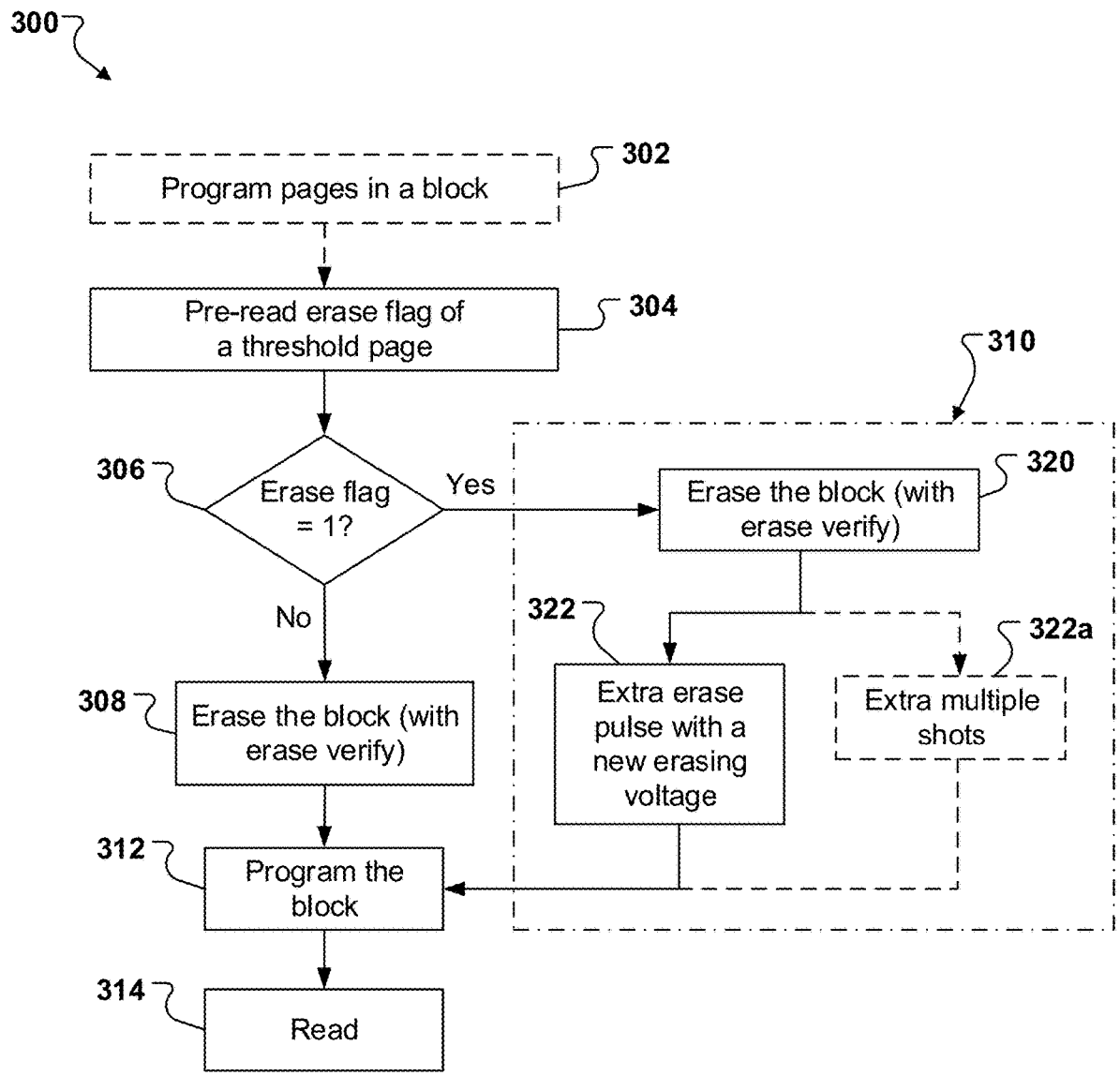
FIG. 3A is a flow chart of a process of efficiently erasing a block with programmed pages using pre-reading and extra erase actions, according to one or more implementations.
Figure 3B:
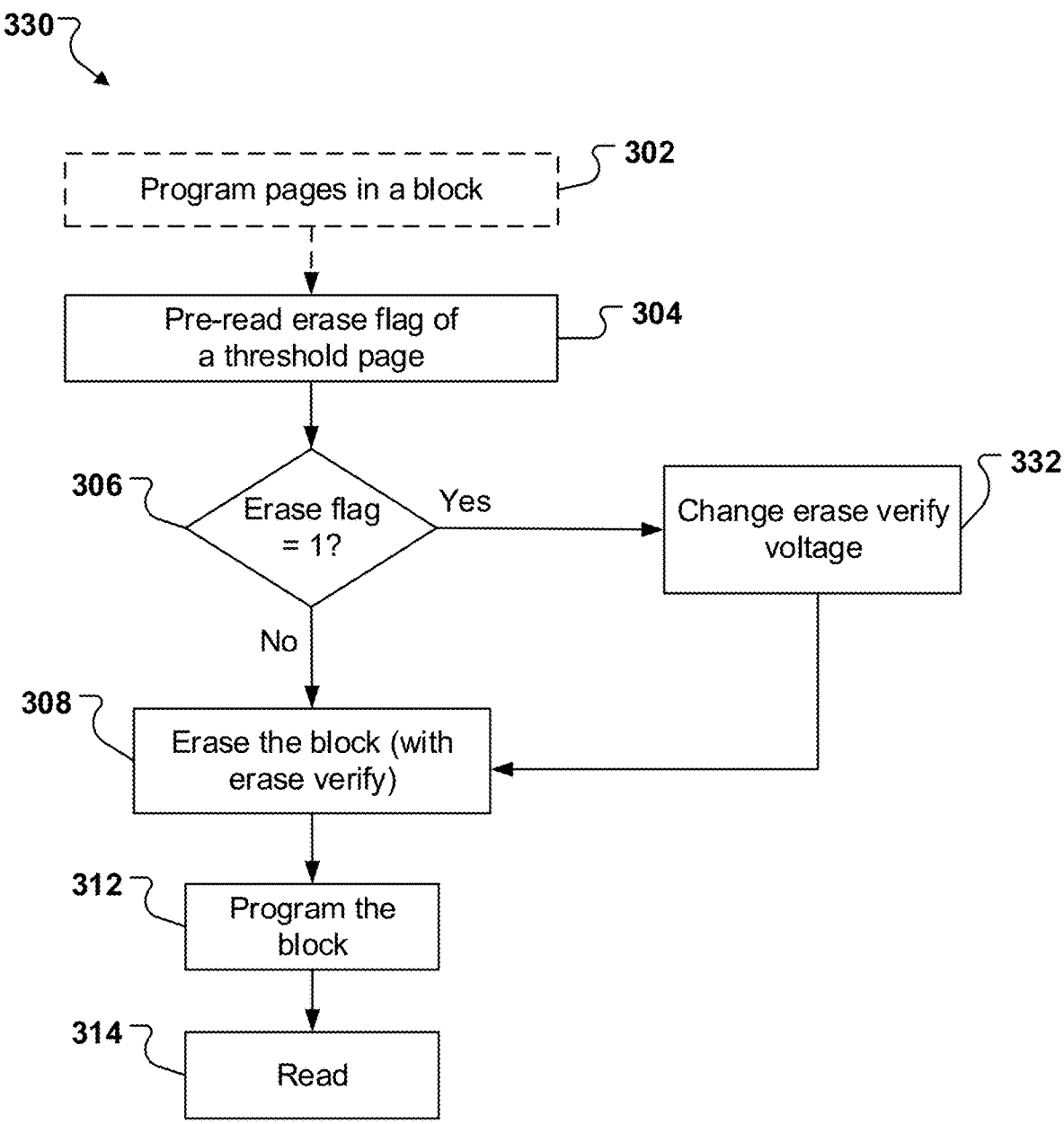
FIG. 3B is a flow chart of a process of efficiently erasing a block with programmed pages using pre-reading and changing erase verify depth actions, according to one or more implementations.
Figure 3C:
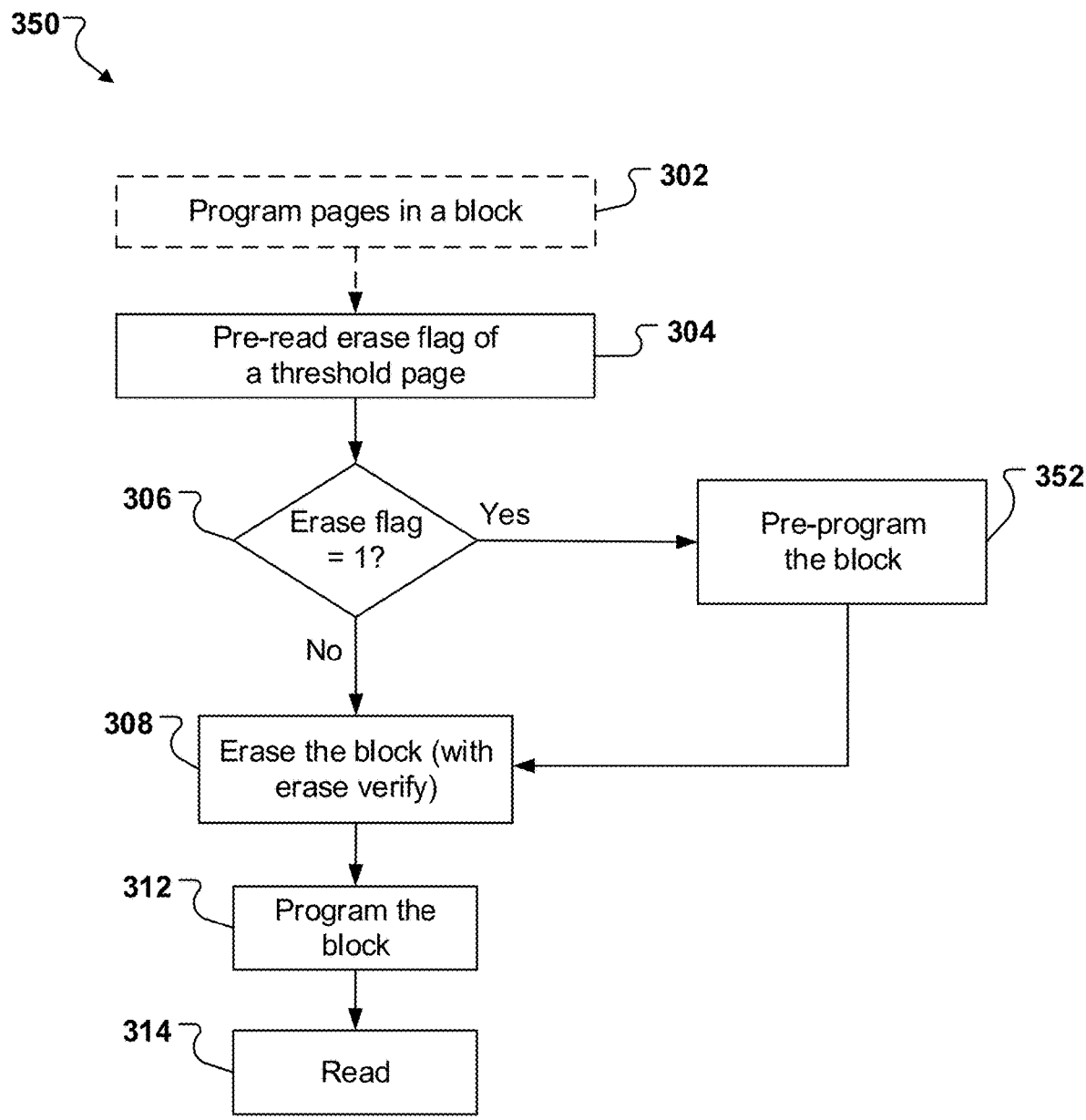
FIG. 3C is a flow chart of a process of efficiently erasing a block with programmed pages using pre-reading and pre-programming actions, according to one or more implementations.

FIGS. 3A-3C show examples of erase actions for erasing a block with programmed pages, according to one or more implementations. The erasing actions can be performed by a controller, e.g., the device controller 112 of FIG. 1A or a controller in the host device 120 of FIG. 1A. The controller may receive a generic erase instruction for the block. The controller determines whether to use a normal erase action on the block or a new erase action on the block by determining whether or not the block has few programmed pages. When the block is determined to have enough programmed pages, the controller can determine that the block is erased with the normal erase action. When the block is determined to have few programmed pages, the controller can determine that the block is erased with the new erase action.

FIG. 3A is a flow chart of a process 300 of efficiently erasing a block with programmed pages using pre-reading and extra erase actions, according to one or more implementations.

Pages in the block are programmed (302). Each page has a respective page number in the block. Data is sequentially programmed in the pages in the block. As noted above, if the block has 64 pages having page numbers from 0 to 63, the data is sequentially programmed into page 0, page 1, page 2, . . . , and page P, where 0<=P<=63.

An erase flag of a threshold page is pre-read (304). The threshold page has a page number X. The page number X can be pre-determined, e.g., based on empirical results. For example, after a block having X programmed pages (with page number from 0 to X−1) is erased with a normal erase action, the block exhibits a shallow erase effect, e.g., as illustrated by curve 202' in FIG. 2A. In contrast, a block having X+1 programmed pages (with page number from 0 to X) does not exhibit the shallow erase effect after a normal erase action. Thus, the page number X can be determined to be a threshold number and a page having the page number X is the threshold page in the block.

The controller determines whether or not the erase flag is identical to 1 (306). As noted above, if the erase flag is not identical to 1, that is, identical to 0, it indicates that the threshold page has been programmed. Thus, the controller determines that the block has enough programmed pages for the block to be erased with a normal erase action with low risk of the shallow erase problem.

In response to determining that the erase flag is not identical to 1, the controller proceeds to erase the block with the normal erase action including erase verify (308). As noted above, in the normal erase action, the block is erased by repeating erasing and verifying cycles until a number of memory cells (or a count of bits) that each have threshold voltages no smaller than a normal erase verify voltage $E_V$ is smaller than a predetermined number. In the multiple cycles, an erasing voltage of the erasing pulse (or shot) is increased with a fixed step voltage, e.g., 1 V per cycle, and the erase verify voltage $E_V$ is fixed.

If the erase flag is identical to 1, it indicates that the threshold page is not programmed, and there are at most X pages that have been programmed in the block. That is, the controller determines that the block has few programmed pages and if the block were to be erased with the normal erase action there would be a risk of the shallow erase problem. Thus, the controller can determine to perform a new erase action 310.

In the new erase action 310, the controller first erases the block with the normal erase action including erase verify (320). Step 320 can be identical to step 308. After step 320, the controller can add an extra erase pulse with a new erasing voltage (322). The new erasing voltage Vnew can be larger than the last erasing voltage Vlast in the normal erase action by an extra voltage ΔV, that is, Vnew=Vlast+ΔV. The extra voltage ΔV can be identical to or different from the fixed step voltage in the normal erase action. The extra voltage ΔV can be related to the page number X of the threshold page. The extra voltage ΔV can be determined based on empirical results. For example, each of multiple blocks having X programmed pages is first erased with the normal erase action and then is erased with a new erasing voltage Vnew. The extra voltage ΔV can be adjusted until the block exhibits no shallow erase problem. In some cases, the controller can add two or more extra erase pulses with a varied extra voltage ΔV.

Alternatively, after step 320, the controller can add extra multiple shots (322a). In some cases, each extra shot (or pulse) has an erasing voltage increased from a preceding erasing voltage by the fixed step voltage in the normal erasing operation, e.g., 1 V. That is, the extras shots continue the normal erasing operation with the same erasing settings including the fixed step voltage per cycle. The number of multiple shots is related to the page number X of the threshold page, and can be determined based on empirical results. For example, a block having X programmed pages is first erased with the normal erase action and then is erased with an extra shot. The number of the extra shots can be adjusted until the block exhibits no shallow erase problem.

It is noted that in step 320, after the normal erase operation, the block passes erase verify. In step 322 or step 322a, there is no erase verify to be performed. It is also unnecessary to perform the erase verify test because the block is further erased and the number of memory cells having threshold voltages larger than the erase verify voltage $V_E$ is also reduced. The block can surely pass the erase verify test after the extra erase in step 322 or step 322a.

After step 308 or step 310, the process 300 proceeds to step 312 where the block is programmed according to a normal programming action. Then the block is read according to a normal read action (314). In some cases, from the read action, a distribution of threshold voltages of memory cells (or bits) in the block can be obtained, e.g., as illustrated in FIG. 2A. Whether a block exhibits shallow effect problem can be determined based on the obtained distribution of threshold voltages of memory cells in the block.

FIG. 3B is a flow chart of another process 330 of efficiently erasing a block with programmed pages using pre-reading and changing erase verify depth actions, according to one or more implementations. Steps in process 330 are similar to the steps in process 300 of FIG. 3A, except step 332.

In response to determining that the erase flag of the threshold page is identical to 1, before performing the erasing step 308, the controller changes the erase verify voltage for the erase verify operation from a predetermined voltage to a modified, e.g., lower, voltage. For example, if the erase verify voltage $V_E$ is shifted to a lower (or deeper) level, e.g., from 0.3 V to 0.2 V, the block that passes the erase verify with a higher erase verify voltage, e.g., 0.3 V, cannot pass the erase verify with a lower erase verify voltage, e.g., 0.2 V. Thus, in step 308, the block has to be erased one or more times until the block can pass the erase verify with the lower erase verify voltage. In such a way, extra erase is performed on the block to eliminate the shallow erase problem. In contrast, if step 332 is not performed, then in step 308 the predetermined voltage is used for the erase verify voltage.

The changed erase verify voltage can be related to the page number X of the threshold page. The changed erase verify voltage can be determined based on empirical results. For example, a block having X programmed pages is erased in a normal erase operation with a changed erase verify voltage. The erase verify voltage number can be adjusted until the block exhibits no shallow erase problem.

FIG. 3C is a flow chart of a further process 350 of efficiently erasing a block with programmed pages using pre-reading and pre-programming actions, according to one or more implementations. Steps in process 350 are similar to the steps in process 300 of FIG. 3A, except step 352.

In response to determining that the erase flag of the threshold page is identical to 1, the controller performs pre-programming on the block before performing the erasing step 308. For example, the block can be pre-programmed by applying a programming pulse with a programming voltage. All pages in the block can be pre-programmed in step 352 such that the block has enough programmed pages or programmed bits before erasing. Step 352 does not include verifying whether memory cells are programmed to a particular programmed state. Instead, only the programming pulse is applied onto the block. The programming voltage can be related to the page number X of the threshold voltage. The programming voltage can be determined based on empirical results.

In some implementations, two or more pre-determined threshold pages are pre-determined for a block. For example, the block has 64 pages, and page 5 and page 10 can be determined as threshold pages. The controller can first pre-read an erase flag of a first threshold page with a larger page number, e.g., page 10. If the erase flag of the first threshold page is not 1, the controller determines that the block has enough programmed pages can be erased with the normal erase action. If the erase flag of the first threshold page is 1, the controller can continue to pre-read the erase flag of a second threshold page with a smaller page number, e.g., page 5.

If the erase flag of the second threshold page is not 1, the controller determines that the block has a number of programmed pages between the smaller page number and the larger page number, e.g., 6-10 programmed pages. The block can be erased with a first erase action that is different from the normal erase action. As illustrated in FIGS. 3A-3C, the first erase action can include adding an extra pulse with a varied extra voltage or extra multiple shots, or changing erase verify voltage, or pre-programming the block. The first erase action can be determined based on empirical results, e.g., like the method as noted above.

If the erase flag of the second threshold page is 1, the controller determines that the block has few programmed pages, e.g., at most with 5 programmed pages. The block can be erased with a second erase action that is different from the first erase action and the normal erase action. As illustrated in FIGS. 3A-3C, the first erase action can include adding an extra pulse with a varied extra voltage or extra multiple shots, or changing erase verify voltage, or pre-programming the block. The second erase action can be determined based on empirical results, e.g., like the method as noted above. The second erase action erases the block deeper than the first erase action as the number of programmed pages is smaller.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A system comprising:
a memory comprising blocks each having a plurality of pages; and
a controller coupled to the memory and configured to:
determine whether a threshold page with a particular page number in a block of the memory is programmed;
in response to determining that the threshold page is programmed, erase the block according to a normal erase action; and
in response to determining that the threshold page is not programmed, erase the block according to a particular erasing action that is configured to erase the block deeper than the normal erase action.

2. The system of claim 1, wherein the controller is configured to determine whether the threshold page is programmed by determining whether a flag of the threshold page is identical to a set value.

3. The system of claim 2, wherein the controller is configured to:
read the flag of the threshold page from the memory.

4. The system of claim 1, wherein the particular page number is pre-determined by empirical results.

5. The system of claim 1, wherein the controller is configured to erase the block according to the normal erase action by
performing a first erase-verify cycle comprising:
applying an erasing pulse with a normal erasing voltage on the block; and
performing an erase verify test by verifying whether a number of memory cells having threshold voltages no smaller than a normal erase verify voltage is smaller than a threshold number;
in response to determining that the number of memory cells is smaller than the threshold number, determining that the block passes the erase verify test and performing no further erasing; and
in response to determining that the number of memory cells is not smaller than the threshold number, performing one or more erase-verify cycles until the block passes the erase verify test, wherein the normal erasing voltage is increased by a step voltage per cycle.

6. The system of claim 5, wherein the controller is configured to erase the block according to the particular erasing action by
erasing the block according to the normal erasing action, and then
performing an extra erase on the block.

7. The system of claim 6, wherein the controller is configured to perform the extra erase on the block by
applying an extra erase pulse on the block with a particular erasing voltage, wherein the particular erasing voltage is higher than a preceding erasing voltage applied on the block by an extra voltage.

8. The system of claim 7, wherein the extra voltage is associated with the particular page number of the threshold page.

9. The system of claim 7, wherein the extra voltage is pre-determined based on empirical results.

10. The system of claim 6, wherein the controller is configured to perform the extra erase on the block by applying one or more erase pulses on the block, and
wherein an erasing voltage in each of the erase pulses is higher than a preceding erase voltage applied on the block by the step voltage.

11. The system of claim 10, wherein a number of the one or more erase pulses is associated with the particular page number of the threshold page.

12. The system of claim 10, wherein a number of the one or more erase sets pulses is pre-determined by empirical results.

13. The system of claim 5, wherein the controller is configured to erase the block according to the particular erasing action by
decreasing the normal erase verify voltage by an extra verify voltage to a new erase verify voltage, and
performing erase-verify cycles on the block using the new erase verify voltage.

14. The system of claim 13, wherein the extra verify voltage is associated with the particular page number of the threshold page and pre-determined based on empirical results.

15. The system of claim 5, wherein the controller is configured to erase the block according to the particular erasing action by
   pre-programming the block, and then
   performing erase-verify cycles on the block according to the normal erasing action.

16. The system of claim 15, wherein the controller is configured to pre-program the block by applying a programming voltage on pages of the block such that a number of programmed pages in the block is larger than the particular page number.

17. The system of claim 1, wherein the controller is configured to:
   after erasing the block, program the block,
   read the block to determine a distribution of threshold voltages of memory cells in the programmed block, and
   determine whether the block exhibits an effect of shallow erase based on a result of the determined distribution of threshold voltages of memory cells in the programmed block.

18. The system of claim 1, wherein the controller is configured to:
   determine whether a first threshold page with a first page number in the block is programmed;
   in response to determining that the first threshold page is programmed, erase the block according to the normal erase action;
   in response to determining that the first threshold page is not programmed, determine whether a second threshold page with a second page number in the block is programmed, the second page number being smaller than the first page number;
   in response to determining that the second threshold page is programmed, erase the block according to a first erase action that is configured to erase the block deeper than the normal erase action; and
   in response to determining that the second threshold page is not programmed, erase the block according to a second erase action that is configured to erase the block deeper than the first erase action.

19. A method of erasing blocks in a memory, the method comprising:
   determining whether a threshold page with a particular page number in a particular block of the memory is programmed; and
   in response to determining that the threshold page is not programmed, erasing the block according to a particular erasing action that is configured to erase the block deeper than a normal erase action,
   wherein the normal erase action is applied for a block having a plurality of programmed pages, a number of the plurality of programmed pages being larger than the particular page number.

20. The method of claim 19, wherein the particular erasing action comprises at least one of
   pre-programming the block before erasing the block,
   decreasing an erase verify voltage before erasing the block, or
   adding one or more erasing pulses with a new erasing voltage.

* * * * *